United States Patent [19]

Kelland

[11] 4,453,136
[45] Jun. 5, 1984

[54] AFC SYSTEM FOR CONTROLLING AN OSCILLATOR ACCORDING TO AN INPUT FREQUENCY

[75] Inventor: Martin J. Kelland, Horsham, England

[73] Assignee: U.S. Philips Corporation, New York, N.Y.

[21] Appl. No.: 310,675

[22] Filed: Oct. 13, 1981

[30] Foreign Application Priority Data

Oct. 22, 1980 [GB] United Kingdom ................. 8034065
Feb. 13, 1981 [GB] United Kingdom ................. 8104628

[51] Int. Cl.$^3$ ............................................... H03L 7/06
[52] U.S. Cl. ................................. 331/1 A; 331/14; 331/16; 331/17; 331/18; 331/30
[58] Field of Search ................... 331/1 A, 1 R, 9, 14, 331/16, 17, 18, 30, 32

[56] References Cited

U.S. PATENT DOCUMENTS 3,378,787 4/1968 Robinson et al. ..................... 331/14
4,006,429 2/1977 Talbot ................................... 331/14

*Primary Examiner*—Siegfried H. Grimm
*Attorney, Agent, or Firm*—Thomas A. Briody; William J. Streeter; Edward W. Goodman

[57] ABSTRACT

An automatic frequency control system includes a frequency measuring unit (IFM), which produces a frequency quantity representing the frequency of its input signal, and a controllable-frequency signal generator (VCO), which produces an output signal whose frequency depends on a control signal supplied to its control input. In a normal mode of operation, IFM derives its input signal from an external source connected to an input terminal (T), and the system derives from the frequency quantity produced by IFM, a control signal for VCO, using a predetermined transfer characteristic, so that the output frequency of VCO is dependent on the frequency of the input signal to IFM, being, for example, equal to the frequency of the signal at T. In order that the system may have an accurate and rapid response, said transfer characteristic is predetermined in a calibration mode of operation in which different control signals for VCO are derived from a calibration signal generator (CSG), resultant input signals for IFM are derived from the output of VCO, and different resultant frequency quantities produced by IFM are associated with respective control signals for VCO by storing digital words representing these control signals in a random-access memory (RAM) at respective addresses which are resultant frequency quantities from IFM. The system may be recalibrated at intervals to take into account drifts in the system.

15 Claims, 4 Drawing Figures

AFC SYSTEM FOR CONTROLLING AN OSCILLATOR ACCORDING TO AN INPUT FREQUENCY

BACKGROUND OF THE INVENTION

This invention relates to a method of operating an automatic frequency control (AFC) system comprising frequency-measuring means and controllable-frequency signal generating means so as to generate with the signal generating means an output signal whose frequency is dependent on that of an input signal, derived from a first source, for the frequency measuring means. The invention further relates to such an AFC system.

AFC systems are used in various radio receiver and receiver/transmitter arrangements. In some cases, it is desirable for the system to have a very rapid response so that the frequency of the output signal generated by the system is accurately related to that of the input signal within as short an interval of time from the reception of the input signal as possible. A known system described in U.S. Pat. No. 3,761,835 uses an iterative process in which a number representative of the actual frequency of the signal generated by a voltage-controlled oscillator is compared at regular intervals with a number representative of the required frequency (the frequency of the input signal) and the voltage used to control the frequency of the oscillator is changed in an attempt to progressively reduce the difference between the frequencies. However, the amount by which the control voltage should be changed so as to approximately equate the frequencies will generally in practice show a considerable variation over the operating frequency range of the system. Consequently, while the accuracy with which the frequencies are eventually related (in this case equated) with such a system may be satisfactory, the time taken to do so may be very long, and may be unacceptably long even when the number of iterations is comparatively small. An alternative approach which enables a quicker response to be obtained is simply to measure the frequency of the input signal and to control the frequency of the oscillator with an appropriate voltage according to a specified/frequency control voltage transfer characteristic of the oscillator. However, not only may this necessitate the use of particularly expensive equipment, but it has been found that even then the matching of the frequencies is not reliably accurate since the characteristics of the system tend to vary, for example with age and temperature.

SUMMARY OF THE INVENTION

It is an object of the invention to provide a method of operating an AFC system and an AFC system which enable a better compromise between accuracy and speed of response to be obtained and which may obviate a requirement for particularly expensive equipment.

According to a first aspect, the invention provides a method of operating an automatic frequency control system comprising frequency measuring means and controllable-frequency signal generating means, the frequency measuring means being operable to produce a frequency quantity related to the frequency of its input signal by a first transfer characteristic and the frequency of the output signal generated by the signal generating means being related to a control signal supplied thereto by a second transfer characteristic, the method including deriving, from a first source, an input signal for the frequency measuring means, producing therewith a respective frequency quantity, using a predetermined third transfer characteristic to derive a control signal from the respective frequency quantity, and supplying that control signal to the signal generating means to control the frequency of the output signal generated thereby, characterized in that the third transfer characteristic is variably predeterminable and in that the determination of said third transfer characteristic comprises the steps of supplying a control signal, derived from a second source, to the signal generating means, deriving from the resultant output signal of the signal generating means, an input signal for the frequency measuring means which in turn produces a resultant frequency quantity, and storing as an associated pair the resultant frequency quantity along with control signal derived from the second source, the relationship between said resultant frequency quantity and its control signal being representative of a combination of the first and second transfer characteristics.

Said relationship may be representative of a combination of the first and second transfer characteristics with one or more further transfer characteristics which are used both in the derivation of the control signal from the first source and in the predetermination of the third transfer characteristic, for example the transfer characteristic of frequency-translating means used in deriving the input signal for the frequency measuring means.

Suitably, the series of said steps for determining the third transfer characteristic is performed repeatedly at spaced intervals of time so as to adjust, if necessary, the third transfer characteristic. Thus, account may be taken of changes in the combination of transfer characteristics since the previous predetermination.

The determination of the third transfer characteristic may comprise the steps of supplying a plurality of different control signals, derived from the second source, to the signal generating means and storing associated pairs of different resultant frequency quantities with respective control signals.

According to a second aspect, the invention provides a method of operating an automatic frequency control system comprising frequency measuring means and controllable-frequency signal generating means so as to generate, with the signal generating means in a normal mode of operation, an output signal, whose frequency is dependent on the frequency of an input signal, derived from a first source, for the frequency measuring means, the method comprising a first calibration mode and a second normal mode of operation, wherein the first mode comprises:

deriving from a second source and supplying to the signal generating means to control the frequency of the output signal generated thereby, a plurality of different control signals in succession; for each of the different control signals, deriving from the respective output signal generated by the signal generating means, a resultant input signal for the frequency measuring means, and producing with the frequency measuring means a resultant frequency quantity representative of the frequency of the resultant input signal thereto; and storing associated pairs of different resultant frequency quantities with respective control signals derived from the second source;

wherein the second mode comprises:

deriving from the first source an input signal for the frequency measuring means, producing therewith a frequency quantity representative of the frequency of that input signal, using the stored associated pairs of resultant quantities and control signals to derive a control signal from the frequency quantity, and supplying that control signal to the signal generating means to control the frequency of the output signal generated thereby;

and wherein the system is repeatedly operated in the first mode at spaced intervals of time.

The or each stored associated pair may comprise a respective control quantity in digital form representative of the respective control signal in analog form derived from the second source.

Each frequency quantity may be in digital form and associated pairs of frequency quantities and control signals may be stored for all different frequency quantities producible by the frequency measuring means in a desired operating frequency measurement range.

A method embodying the first or second aspects of the invention may include frequency-modulating the output signal generated by the signal generating means with the control signal related to the input signal derived from the first source. Frequency modulation may be performed by introducing a time variation into the derivation of the control signal from the frequency quantity before using said third transfer characteristic or said stored associated pairs, the time variation being introduced into a digital quantity.

According to a third aspect, the invention provides an automatic frequency control system for generating, in a normal mode of operation, an output signal whose frequency is dependent on the frequency of a signal supplied to a first input of the system, the system comprising controllable-frequency signal generating means, frequency measuring means and control means for controlling the frequency of an output signal generated by the signal generating means at its output, the system being operable in a first, calibration mode and in a second, normal mode, wherein the signal generating means are operable to generate at an output thereof, an output signal whose frequency is controlled, in the first mode, by a control signal or a plurality of different control signals in succession derived from a signal or signals supplied to a second input of the system and, in the second mode, by a control signal supplied by the control means, wherein the frequency measuring means are operable to produce a frequency quantity representative of the frequency of an input signal which is derived in the first mode from the signal generated at the output of the signal generating means and in the second mode from said signal supplied to the first input, and wherein the control means are operable in the first mode to store an associated pair of the frequency quantity, or associated pairs of different frequency quantities, produced by the frequency measuring means with the control signal, or with respective control signals, derived from the second input and, in the second mode, to use the stored associated pair(s) of frequency quantities and control signals to derive a control signal from the frequency quantity representative of the frequency of the signal derived from the signal supplied to the first input and to supply that control signal to the signal generating means for controlling the frequency of the output signal thereof.

The frequency quantities produced by the frequency measuring means may be in digital form and the control means may comprise an addressable store and are operable to store control quantities therein at respective addresses determined by different frequency quantities, the store having respective addresses for all different frequency quantities producible by the frequency measuring means in a desired operating frequency measurement range.

The control means may comprise means for frequency-modulating the output signal of the signal generating means in the second mode.

The system may be in combination with a source operable to supply to the second input of the system, a signal or signals from which a control signal or a plurality of different control signals are derived in the first mode. The source is suitably operable to supply signals such that, in the first mode, the frequency measuring means produces all different freqency quantities in a desired operating frequency measurement range. The source may be operable to supply signals for controlling, in the first mode, the times at which the frequency measuring means operate to produce a frequency quantity and the control means operate to store an associated pair of a frequency quantity with a control signal.

DESCRIPTION OF THE DRAWINGS

An embodiment of the invention will now be described by way of example, with reference to the accompanying drawings, in which.

DESCRIPTION OF THE PREFERRED EMBODIMENT

Figure 1:
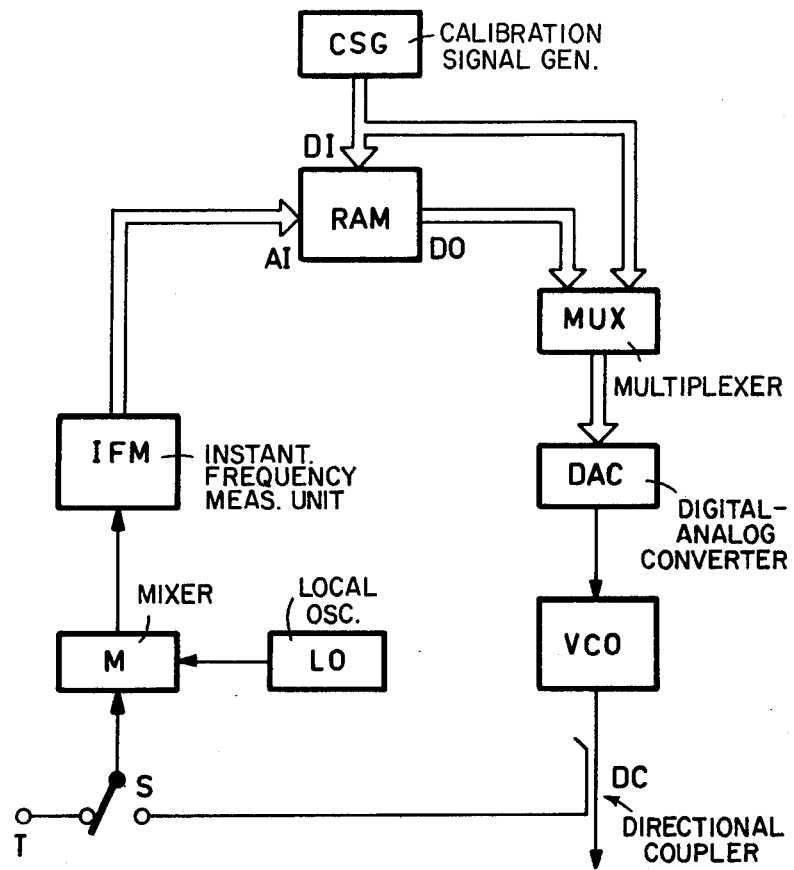
FIG. 1 is a block diagram of an automatic frequency control system embodying the invention.

The system shown in FIG. 1 includes the following units: a voltage-controlled oscillator VCO, a directional coupler DC, a selector switch S, a so-called instantaneous frequency measurement unit IFM, a random-access memory RAM, a multiplexer (or selector switch) MUX and a digital-to-analog converter DAC. The units DC and S enable the signal, whose frequency is measured by IFM, to be derived either from VCO or from an external source connected to an input terminal T. The unit IFM, which may be as described in U.K. Patent Specification 1,385,111, supplies a binary digital word representative of the measured frequency of its input signal to an address input AI of RAM.

In order that the system may handle signals whose frequencies lie above the operating range of measurement of the unit IFM, signals from switch S are mixed in a mixer M with a local-oscillator signal of a known fixed frequency from a unit LO to produce intermediate-frequency signals which lie in said range.

To set up the system to handle signals of unknown frequency from terminal T, the system is operated in a first calibration mode in which different digital control words are supplied in succession from a calibration signal generator CSG to a data input DI of RAM, and corresponding control signals are derived therefrom via MUX and DAC at a frequency-control input of VCO. For each control word, a portion of the output signal generated by VCO at a respective frequency is coupled, via DC and S, and then via M in which it undergoes frequency translation, to an input of IFM which supplies to input AI of RAM a digital frequency word representative of the measured frequency. For each different frequency word, a respective control word, which has been supplied to input DI of RAM and which has resulted in VCO generating an output signal from which that frequency word has been derived, is stored at a respective address represented by that frequency word.

To fully calibrate the system, the arrangement should be such that VCO generates output signals which cause IFM to produce each different frequency word in the desired operating frequency measurement range. Where, as in this case, CSG is a digital signal generator, analog control signals being derived at VCO via DAC, the steps between successive analog signals should be sufficiently small to ensure this, taking into account the possibility of non-linearity in the frequency/control voltage transfer characteristic of VCO; in addition, the range of signals generated by CSG and the characteristics of DAC, VCO and IFM should be appropriately matched (taking into account the frequency translation provided by M and LO). This will normally have the result that for one or more frequency words, the same frequency word is produced by IFM for at least two successive control words generated by CSG. In that case, the control word which is eventually stored at the address represented by that frequency word is the one that was last supplied to input DI of RAM.

After calibration, the system can be operated in a second, normal mode in which the input of IFM is coupled to the input terminal T via S and M, and in which a data output DO of RAM is coupled to the input of VCO via MUX and DAC. A signal of unknown frequency supplied to input terminal T of the system undergoes frequency translation in mixer M and the resulting i.f. signal is supplied to the input of IFM. The resulting frequency word, representative of the frequency measured by IFM, is used to address RAM, the control word stated at that address being produced at the output DO of RAM from which a control voltage is derived at the input of VCO via MUX and DAC. Provided there have been no changes in the characteristics of the AFC loop since calibration, the frequency of the signal generated by VCO should then be the same as that of the signal which was supplied to terminal T, to within the measurement accuracy of IFM (which will depend on the frequency digitization intervals).

To take account of changes in the loop characteristics (due, for example, to a change of temperature), the system may be recalibrated. This may, for example, be done at regular intervals, provided the system is not required to operate in the second mode when recalibration would be due (in which case recalibration may be postponed).

It will be seen that in the AFC system of FIG. 1, the frequency of the signal generated by VCO in the second mode bears a predetermined relationship to the frequency of the signal derived at the input of IFM from terminal T, namely they differ by the frequency translation which was provided by M and LO when the system was calibrated. In this case, the signals derived at the input of IFM from VCO and from T undergo nominally the same frequency translation (the frequency translation may drift between the time at which the system is calibrated and the time at which the input signal for IFM is derived from terminal T) so that the frequency of the signal generated by VCO and the frequency of the signal at terminal T are nominally equal, but another relationship could, if desired, be obtained, for example by using different analog or digital processing in the first and second modes, respectively.

Although the above-described system is calibrated (in the first mode of operation) by causing IFM to produce each of the possible different frequency words in its desired operating range and associating each of the frequency words with a respective control word by storing the control word in an addressable store at a respective address represented by the frequency word so that, in the second mode of operation, a control word corresponding to a frequency word representative of an unknown frequency is derived from the direct association in the store of the required control word with that frequency word, a system embodying the invention could be operated by storing, in the first mode associated pairs of one or more frequency words with respective control words and deriving, in the second mode a control word corresponding to a frequency word (not already stored) by calculation. For example, a plurality of frequency words spaced across the operating frequency range could be associated in the first mode with respective control words, and in the second mode a control word corresponding to a frequency word lying between two stored frequency words would be derived assuming that a linear frequency/control signal transfer characteristic in the range between those two stored frequency words. In other words, the relationship between control words and frequency words would be determined partly by calibration of spaced points on the frequency/control signal transfer characteristic and partly by the assumption of linearity at intermediate points.

It may be noted the frequency of the input signal to IFM derived from terminal T may be unknown only in the sense that it is not available in a form suitable for controlling the frequency of the signal generated by VCO, and conversely that the system may make the frequency known only in the sense that it becomes so available. The absolute values of frequency and of frequency words and control words and signals need not be known and need be of no significance other than that the system stores associated pairs of one or more frequency words resulting from the system's own measurement with respective control signals (except that the control signal or signals used for calibration must be such as to enable operation of the system over the desired frequency range). The system is thus effectively, partly or wholly, self-calibrating.

Figure 2:
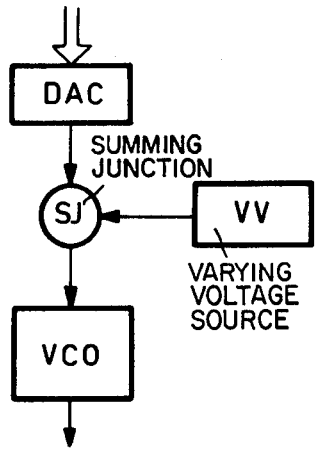
FIGS. 2 and 3 show modifications to the system of FIG. 1.
Figure 3:
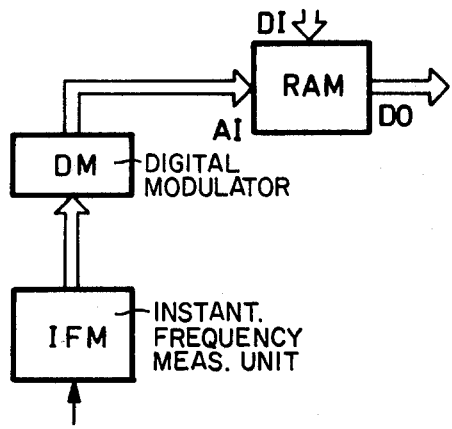

The output signal of the voltage-controlled oscillator in the second mode of operation may be frequency-modulated in a predetermined or a random manner. In the former case, the frequency of the output signal of the oscillator will vary in known manner with respect to the frequency of the input signal at terminal T. In the latter case, the frequency may, for example, be varied rapidly (e.g. with noise) over a small range so as to take into account inaccuracies in the system (e.g. the possible inaccuracy inherent in digitization of frequency by IFM) and of small instantaneous variations and thus to try to ensure that the frequency of the input signal at terminal T always lies within the range of frequencies being generated by the oscillator. Two modifications of the system of FIG. 1, to perform frequency modulation with the control signal derived from the signal at the input terminal T by introducing a time variation into the derivation of the control signal from the frequency word, are shown in FIGS. 2 and 3, respectively (which show only the relevant part of the system), and may be used separately or together. In the modification of FIG. 2, the frequency modulation is performed after deriving an appropriate control word from RAM by adding to the voltage produced by DAC, a voltage produced by a varying-voltage source VV, the addition being carried out in a summing junction SJ and the resultant control voltage supplied to the input of VCO. In the modification of FIG. 3, the frequency modulation is performed before deriving a control word from RAM by digitally modulating the frequency word produced by IFM with a digital modulator DM so that the control word derived in RAM from a particular frequency word produced by IFM varies with time. The digital modulator may for example comprise means for producing a digital quantity which increases progressively from zero to a maximum and then returns to zero, and means for adding and/or subtracting this digital quantity to and/or from the frequency word, thus producing a quasi-sawtooth modulation.

Performing frequency modulation by introducing a time variation into the derivation of the control signal from the frequency word before (rather than after) RAM, as in FIG. 3, has the advantage that the output frequency of VCO can easily be varied to a predetermined extent which remains constant over the whole range of output frequencies of VCO, whereas in an arrangement such as that of FIG. 2, the extent to which the frequency is varied by a particular value of the voltage from source VV will (since the transfer characteristic of VCO is generally non-linear) depend on which part of that characteristic is being used).

To cover a wider frequency range than the instantaneous range of IFM, the system may comprise a plurality of VCO units, each associated with a respective RAM, and an equal number of different LO units; the frequency bands of the VCOs may partly overlap. For example, to cover an output frequency range of approximately 8–16 GHz using an IFM capable of handling frequencies in the range of 1.7–4.2 GHz, the system may comprise four LO units with respective frequencies of 6, 8, 10 and 12 GHz and four VCOs respectively covering the ranges of 7.7–10.2 GHz, 9.7–12.2 GHz, 11.7–14.2 GHz and 13.7–16.2 GHz. A further IFM unit may be used to indicate in which of the four bands a signal supplied to terminal T lies, and the output of the main IFM unit may be taken via a further store which adds to the frequency word two further (most-significant) digits to designate the appropriate VCO.

Other processing of the frequency word from IFM may also be performed before the word is supplied to RAM. The system may for example comprise between the output of IFM and the input AI of RAM digital filter means which suitably can be adjusted to pass only those frequency words which represent frequencies lying within a desired range.

The system may further comprise, between the output of IFM and the input AI of RAM, one or more stores for storing respective frequency words so that the system may respond to a signal which has been received at terminal T at any desired time, for example when that signal is not being received.

It will be seen that in the system of FIG. 1, the mixer M and the local oscillator LO are used in deriving an input signal for IFM both from the output of VCO and from terminal T. Consequently, the system's self-calibration will also eliminate the effect of any gradual change in the frequency translation provided by M and LO since the calibration includes that transfer characteristic. Hence, the frequency stability of LO need only be such as to prevent any substantial change between operation in the first and second modes, and, as a result, it may be possible to use for LO a cavity-stabilized oscillator rather than a crystal-controlled oscillator which might otherwise be necessary, thereby effecting a significant reduction in cost. The saving is of course even greater in a system comprising a plurality of different LO units.

Figure 4:
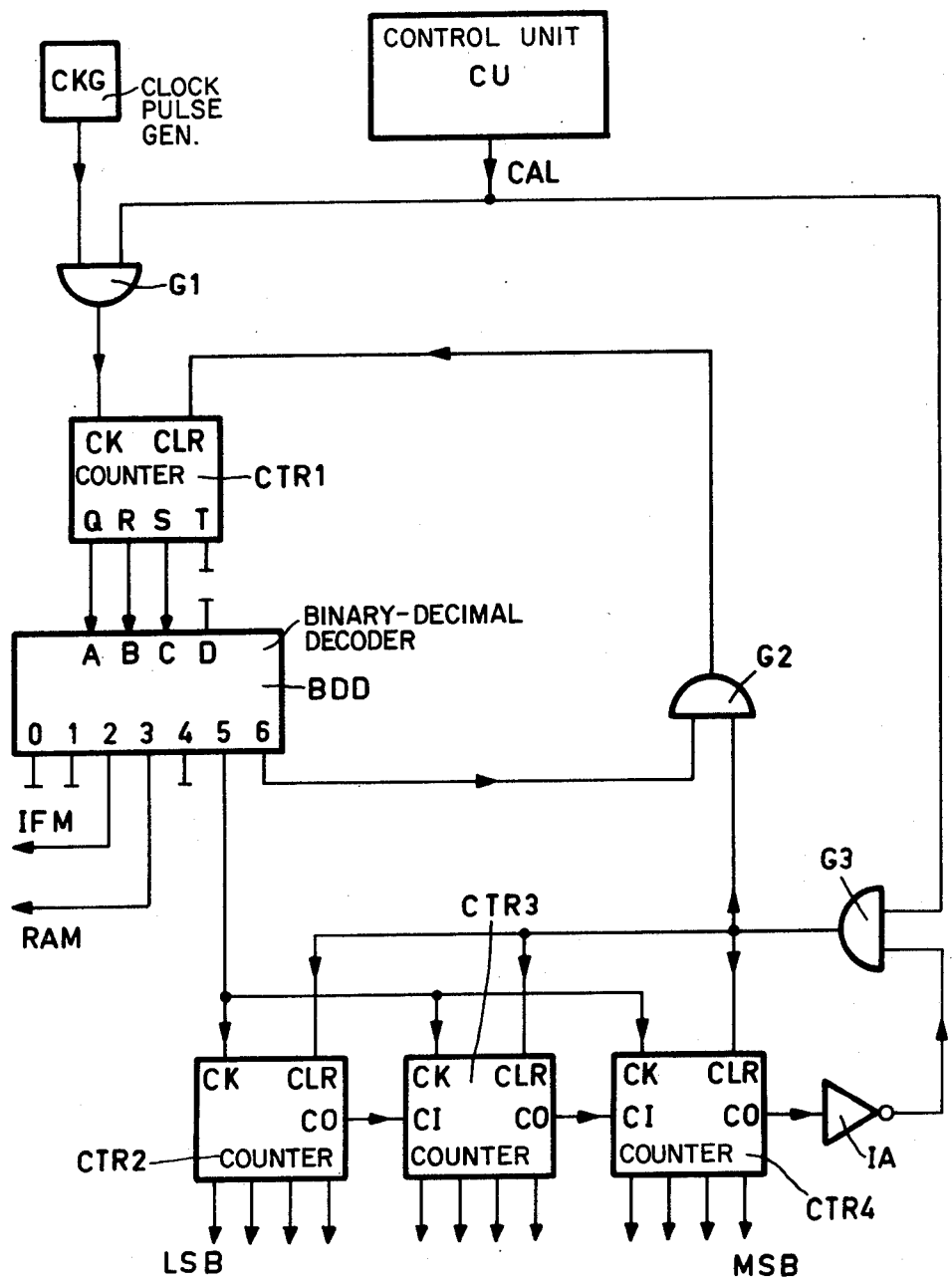
FIG. 4 is a block diagram of a circuit for a calibration signal generator.

An arrangement suitable for use as the calibration signal generator CSG is shown in FIG. 4. The arrangement is controlled by a control unit CU which produces a calibration control signal CAL and which also controls the switching of the multiplexer MUX and switch S, the sequential operation of the circuit being produced by a continuously-operating clock pulse generator CKG. The arrangement comprises four 4-bit binary counters CTR1, CTR2, CTR3 and CTR4 respectively, a binary-to-decimal decoder BDD, three AND gates G1, G2 and G3 respectively, and an inverter amplifier IA. The combination of the counter CTR1 and the decoder BDD advances the counters CTR2–CTR4, the parallel 4-bit outputs of which together provide a 12-bit control word which is supplied to input DI of RAM and to MUX (see FIG. 1), the combination also providing timing control signals. Each counter has a respective clock input CK, and is advanced by a positive-going edge of a pulse applied to CK. For each of the counters CTR2 and CTR3, after the counter has been advanced to its maximum count, a further clock pulse will clear the counter (i.e. reset the count to zero). Each of the four counters also has a respective clear input CLR. The signal normally applied to CLR during operation is a logic 1, allowing the counter to be advanced by clock pulses; when the signal changes to a logic zero, the counter is reset to zero, and cannot be advanced until the signal returns to logic 1.

Three parallel outputs Q, R and S of CTR1 are connected to respective parallel inputs A, B and C of BDD; the most-significant-bit output T and input D are not required in this arrangement. Decoder BDD has seven outputs, numbered 0–6, respectively, in FIG. 4, which are "active low", i.e. all outputs except one are at logic 1, the exception being a logic zero which initially is at output 0 and which is moved from left to right (as shown) as the decoder BDD is advanced. Only four of these outputs are utilized, namely outputs 2 and 3 which provide timing control signals, output 5 which is used to advance counters CTR2–CTR4, and output 6 which is used to reset CTR1 and hence the decoder itself, output 5 being connected to inputs CK of counters CTR2–CTR4 and output 6 being connected to a first input of gate G2, the output of which is connected to input CLR of CTR1.

Counters CTR2–CTR4 are advanced by the positive-going pulse edge produced when output 5 of BDD returns from logic zero to logic 1. Counters CTR2 and CTR3 have respective carry outputs CO connected to respective carry inputs CI of CTR3 and CTR4 respectively. A carry output CO of CTR4 is connected to the input of the inverter IA, the output of which is connected to one input of gate G3, the other input of gate G3 receiving the calibration control signal CAL from the control unit CU.

The signal at output CO of CTR4 during calibration is normally logic zero, so that the output signal of the inverter IA is normally logic 1. Thus the output signal of gate G3 also is logic 1, and hence too is the output signal of gate G2.

The operation of the arrangement is as follows. Initially all the outputs of the four counters are at logic zero, as is output 0 of decoder BDD, the remaining outputs thereof being at logic 1. The calibration signal CAL from control unit CU is zero, thus preventing clock pulses from entering the arrangement at gate G1. In the calibration mode, the control unit changes the signal CAL to, and maintains it at, logic 1. Clock pulses from CKG are thus applied to input CK of counter CTR1, causing the binary number represented at its outputs Q to S to advance progressively from 0 to 6, and the active output of decoder BDD to move progressively from output 0 to output 6. When output 2 changes from logic 1 to logic zero, the IFM unit samples the signal being applied to its input and measures its frequency; when output 3 changes from logic 1 to logic zero, the store RAM enters the number at its data input DI at the address specified at its address input AI, the address being derived from the output of the IFM unit.

The first frequency measured by IFM in this calibration process is that of a signal derived from VCO (via DC, S and M: see FIG. 1) when the control signal applied to the input of VCO is that produced by converter DAC when the digital quantity (the control word) applied thereto is zero.

When output 5 of BDD returns from logic zero to logic 1, counter CTR2 is advanced so that its least significant bit (LSB) becomes 1. When output 6 of BDD changes from logic 1 to logic zero, the output of gate G2 also changes from logic 1 to logic zero, clearing counter CTR1; after output 6 of BDD returns to logic 1, this cycle can start again, CTR1 being advanced from zero to 1 by the next clock pulse received at its input CK from CKG via G1.

Thus in each cycle of operation of CTR1 and BDD in the calibration mode, the AFC system produces a frequency word representing the frequency of the signal derived at the input of IFM, the system then storing the control word (the 12-bit output of CTR2-CTR4) at the address represented by this frequency word, the frequency of the signal produced by VCO (from which the input signal for IFM is derived) being determined by the control word first produced by CTR2-CTR4 during the immediately preceding cycle. The delay between these counters being advanced in one cycle and IFM sampling its input signal in the next cycle allows VCO to settle after the small change in the control word, and the interval between the timing control signals to IFM and to RAM provides time for IFM to measure the frequency of its input signal and for the frequency word to be derived at input AI of RAM.

After the counters CTR2-CTR4 have been advanced to their maximum count, represented by all their outputs being at logic 1, the next pulse applied to the counters causes counter CTR4 to generate a logic 1 at its carry output CO. This causes one input signal of gate G3 to change from logic 1 to logic 0, causing in turn the output signal of G3 to change from logic 1 to logic 0. This clears counters CTR2-CTR4 and, via G2 whose output signal similarly changes from logic 1 to logic 0, clears counter CTR1. If the calibration signal CAL is maintained at logic 1, the complete calibration process will restart; the carry output returns to logic 1 on receipt of the next clock pulse. When CAL returns to logic zero, the effect is the same as that just described, i.e. all the counters are cleared, and in addition, the calibration process stops since clock pulses can no longer enter the arrangement at gate G1.

The control unit CU shown in FIG. 4 may also control the switching of switch S and multiplexer MUX in FIG. 1.

The clock pulse generator CKG may generate pulses with a pulse repetition frequency of, for example, 1 MHz.

I claim:

1. A method of operating an automatic frequency control system comprising frequency measuring means and controllable-frequency signal generating means, the frequency measuring means being operable to produce a frequency quantity related to the frequency of its input signal by a first transfer characteristic and the frequency of the output signal generated by the signal generating means being related to a control signal supplied thereto by a second transfer characteristic, the method including, in an operating mode, deriving from a first source an input signal for the frequency measuring means, producing therewith a respective frequency quantity, using a predetermined third transfer characteristic to derive a control signal from the respective frequency quantity, and supplying that control signal to the signal generating means to control the frequency of the output signal generated thereby, characterized in that the third transfer characteristic is variably predeterminable and in that the determination thereof, in a separate calibration mode, comprises the steps of supplying a control signal, derived from a second source, to the signal generating means, deriving from the resultant output signal of the signal generating means, an input signal for the frequency measuring means, which in turn produces a resultant frequency quantity, and storing as an associated pair of resultant frequency quantity along with the control signal derived from the second source, the relationship between the resultant frequency quantity and its control signal being representative of a combination of the first and second transfer characteristics.

2. A method as claimed in claim 1, wherein the series of said steps for determining said third transfer characteristic is performed repeatedly at spaced intervals of time so as to adjust, if necessary, the third transfer characteristic.

3. A method as claimed in claim 1 or 2, wherein the determination of the third transfer characteristic further comprises the steps of supplying a plurality of different control signals derived from the second source to the signal generating means and storing associated pairs of different resultant frequency quantities with respective control signals.

4. A method of operating an automatic frequency control system comprising frequency measuring means and controllable-frequency signal generating means so as to generate with the signal generating means, in a normal mode of operation, an output signal whose frequency is dependent on the frequency of an input signal derived from a first source and applied to the frequency measuring means, the method comprising a first, calibration mode and a second, normal mode of operation, wherein the first mode comprises:

deriving from a second source and supplying to the signal generating means to control the frequency of the output signal generated thereby, a plurality of different control signals in succession; for each of the different control signals, deriving from the respective output signal generated by the signal generating means, a resultant input signal for the frequency measuring means, which in turn produces a resultant frequency quantity representative of the frequency of the resultant input signal; and storing associated pairs of different resultant frequency quantities with the respective different control signals derived from the second source;

wherein the second mode comprises:

deriving from the first source an input signal for the frequency measuring means, producing therewith a frequency quantity representative of the frequency of that input signal, using the stored associated pairs of frequency quantities and control signals to derive a control signal from the frequency quantity, and supplying that control signal to the signal generating means to control the frequency of the output signal generated thereby;

and wherein the system is repeatedly operated in the first mode at spaced intervals of time.

5. A method as claimed in claim 4, wherein each stored associated pair comprises a respective control quantity in digital form representative of the respective control signal in analog form derived from the second source.

6. A method as claimed in claim 4 or 5, wherein each frequency quantity is in digital form and wherein the associated pairs of frequency quantities and control signals are stored for all different frequency quantities producible by the frequency measuring means in a desired operating frequency measurement range.

7. A method as claimed in claim 6, including frequency-modulating the output signal generated by the signal generating means by adding to the control signal of said signal generating means a frequency modulation component.

8. A method as claimed in claim 6 wherein frequency modulation is performed by introducing a time variation into the derivation of the control signal from the frequency quantity before using said stored associated pairs, the time variation being introduced into a digital quantity.

9. An automatic frequency control system for generating, in a normal mode of operation, an output signal whose frequency is dependent on the frequency of a signal supplied to a first input of the system, the system comprising controllable-frequency signal generating means, frequency measuring means and control means for controlling the frequency of an output signal generated by the the signal generating means, the system being operable in a first, calibration mode and in a second, normal mode, wherein the signal generating means are operable to generate an output signal whose frequency is controlled, in the first mode, by a plurality of different control signals in succession derived from signals supplied to a second input of the system, and in the second mode, by a control signal supplied by the control means, wherein the frequency measuring means are operable to produce a frequency quantity representative of the frequency of an input signal which is derived, in the first mode, from the signal generated at the output of the signal generating means and, in the second mode, from said signal supplied to the first input, and wherein the control means are operable, in the first mode, to store associated pairs of different frequency quantities produced by the frequency measuring means, along with the respective control signals derived from the second input and, in the second mode, to use the stored associated pairs of frequency quantities and control signals to derive a control signal from the frequency quantity representative of the frequency of the signal derived from the signal supplied to the first input, and to supply that control signal to the signal generating means for controlling the frequency of the output signal thereof.

10. A system as claimed in claim 9, wherein the control means are operable, in the first mode, to store an associated pair of a frequency quantity with a control signal by storing a digital control quantity representative of the control signal.

11. A system as claimed in claim 10, wherein the frequency quantities produced by the frequency measuring means are in digital form and wherein the control means comprises an addressable store and is operable to store control quantities therein at respective addresses determined by the different frequency quantities, the addressable store having respective addresses for all different frequency quantities producible by the frequency measuring means in a desired operating frequency measurement range.

12. A system as claimed in claim 9, 10 or 11 wherein the control means comprises means for frequency-modulating the output signal of the signal generating means in the second mode.

13. A system as claimed in claim 9, 10 or 11 in combination with a source operable to supply to the second input of the system signals from which a plurality of different control signals are derived in the first mode.

14. A system as claimed in claim 13, wherein the frequency quantities produced by the frequency measuring means are in digital form and wherein the source is operable to supply signals such that, in the first mode, the frequency measuring means produces all the different frequency quantities in a desired operating frequency measurement range.

15. A combination as claimed in claim 14 wherein the source is operable to supply signals for controlling, in the first mode, during the times at which the frequency measuring means operate to produce a frequency quantity and the control means operates to store an associated pair of a frequency quantity with a control signal.

* * * * *